United States Patent
Kim et al.

(10) Patent No.: US 10,678,438 B2
(45) Date of Patent: Jun. 9, 2020

(54) SCHEDULERS AND SCHEDULING METHODS RELATED TO MEMORY SYSTEMS

(71) Applicant: SK hynix Inc., Icheon-si, Gyeonggi-do (KR)

(72) Inventors: Donggun Kim, Hwaseong-si (KR); Jung Hyun Kwon, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 287 days.

(21) Appl. No.: 15/830,426

(22) Filed: Dec. 4, 2017

(65) Prior Publication Data

US 2018/0307411 A1 Oct. 25, 2018

(30) Foreign Application Priority Data

Apr. 21, 2017 (KR) .................. 10-2017-0051542

(51) Int. Cl.
| | |
|---|---|
| *G06F 12/00* | (2006.01) |
| *G06F 13/00* | (2006.01) |
| *G06F 13/28* | (2006.01) |
| *G06F 3/06* | (2006.01) |
| *G06F 13/16* | (2006.01) |
| *G11C 13/00* | (2006.01) |
| *G06F 11/30* | (2006.01) |

(52) U.S. Cl.
CPC ............ *G06F 3/061* (2013.01); *G06F 3/0625* (2013.01); *G06F 3/0679* (2013.01); *G06F 13/1615* (2013.01); *G06F 13/1642* (2013.01); *G06F 13/1689* (2013.01); *G11C 13/0004* (2013.01); *G11C 13/0035* (2013.01); *G11C 13/0061* (2013.01); *G11C 13/0069* (2013.01); *G06F 3/0659* (2013.01); *G06F 11/3072* (2013.01)

(58) Field of Classification Search
CPC .......................... G06F 11/3072; G06F 3/0659
USPC .......................................................... 711/156
See application file for complete search history.

(56) References Cited

U.S. PATENT DOCUMENTS

| | | | |
|---|---|---|---|
| 9,281,046 B2 | 3/2016 | Brandl | |
| 2002/0053921 A1* | 5/2002 | Koshiba | ............ G01R 31/3183 324/762.01 |
| 2009/0016137 A1* | 1/2009 | Hur | ...................... G06F 13/1626 365/226 |
| 2016/0070918 A1* | 3/2016 | Ciordas | .................. G06F 21/14 726/27 |

FOREIGN PATENT DOCUMENTS

| | | |
|---|---|---|
| KR | 1020110118296 A | 10/2011 |
| KR | 1020140032789 A | 3/2014 |

* cited by examiner

*Primary Examiner* — Edward J Dudek, Jr.
*Assistant Examiner* — Sidney Li
(74) *Attorney, Agent, or Firm* — William Park & Associates Ltd.

(57) ABSTRACT

A scheduler of a memory system is provided. The scheduler may include a pattern storage part and a pattern selector. The pattern storage part may have a plurality of storage patterns, each of the storage patterns provide for a process sequence for a plurality of instructions. The pattern selector may be configured to select one of the plurality of storage patterns in the pattern storage part and generate a schedule such that external instructions are executed in the process sequence set by the selected storage pattern.

16 Claims, 5 Drawing Sheets

CRYSTALINE STATE

AMORPHOUS STATE

SCHEDULERS AND SCHEDULING METHODS RELATED TO MEMORY SYSTEMS

CROSS-REFERENCE TO RELATED APPLICATIONS

The present application claims priority under 35 U.S.C 119(a) to Korean Application No. 10-2017-0051542, filed on Apr. 21, 2017, which is herein incorporated by references in its entirety.

BACKGROUND

1. Technical Field

Various embodiments of the present disclosure generally relate to schedulers of memory systems and methods of scheduling operation instructions of the memory systems using the schedulers.

2. Related Art

Recently, memory devices using a semiconductor material have been increasingly demanded with the development of portable systems such as mobile phones. The memory devices are typically categorized as either volatile memory devices or nonvolatile memory devices. In particular, since most of the portable systems tend to employ large capacities of memory, the nonvolatile memory devices retaining their stored data even when their power supplies are interrupted have been widely used in various portable systems. Ferroelectric random access memory (FeRAM) devices, magnetic random access memory (MRAM) devices, resistive random access memory (RRAM) devices, phase change memory (PCM) devices or the like are very attractive as the next generation nonvolatile memory devices.

The PCM devices among the next generation nonvolatile memory devices have been known as attractive nonvolatile memory devices since the PCM devices have a relatively simple cell structure as compared with the other nonvolatile memory devices and exhibit a relatively high operation speed like dynamic random access memory (DRAM) devices which belong to the volatile memory devices. The PCM devices may store and read information using a difference in electric conductivity between an amorphous phased material and a crystalline phased material of a specific material. In order to perform a write operation for storing data into cells of the PCM device, it may be necessary to force a current larger than a certain amount into the cells having a phase changeable material during a period longer than a certain time to change a phase of the phase changeable material. Accordingly, power consumption of the PCM devices may be higher than power consumption of the other next generation nonvolatile memory devices, while the write operation is performed.

Multiple operations may be independently performed with queues, pipelines and parallel operations to improve the performance of the PCM devices. In order to efficiently execute the multiple operations, a scheduling process for properly reorganizing a sequence of operation instructions may be required. In such a case, it may be necessary to evaluate the electric power consumed by execution of operations of the PCM devices to prevent the PCM devices from operating out of an allowable range of the electric power. Therefore, it may be necessary to calculate the electric power consumed by each of operations performed in the PCM device. This is for holding the execution of a subsequent operation until the current operations terminate if there is a possibility that power consumption of the PCM device is out of the allowable range due to the subsequent operation.

SUMMARY

According to an embodiment, there is provided a scheduler of a memory system. The scheduler may include a pattern storage part and a pattern selector. The pattern storage part may have a plurality of storage patterns, each of the storage patterns provide for a process sequence for a plurality of instructions. The pattern selector may be configured to select one of the plurality of storage patterns in the pattern storage part and generate a schedule such that external instructions may be executed in the process sequence set by the selected storage pattern.

According to an embodiment, there is provided a method of scheduling a memory system. The method may include preparing a pattern list having a plurality of storage patterns, each of the storage patterns provide for a process sequence for a plurality of instructions. One of the plurality of storage patterns in the pattern list may be selected. A schedule may be generated such that external instructions may be executed in the process sequence set by the selected storage pattern.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
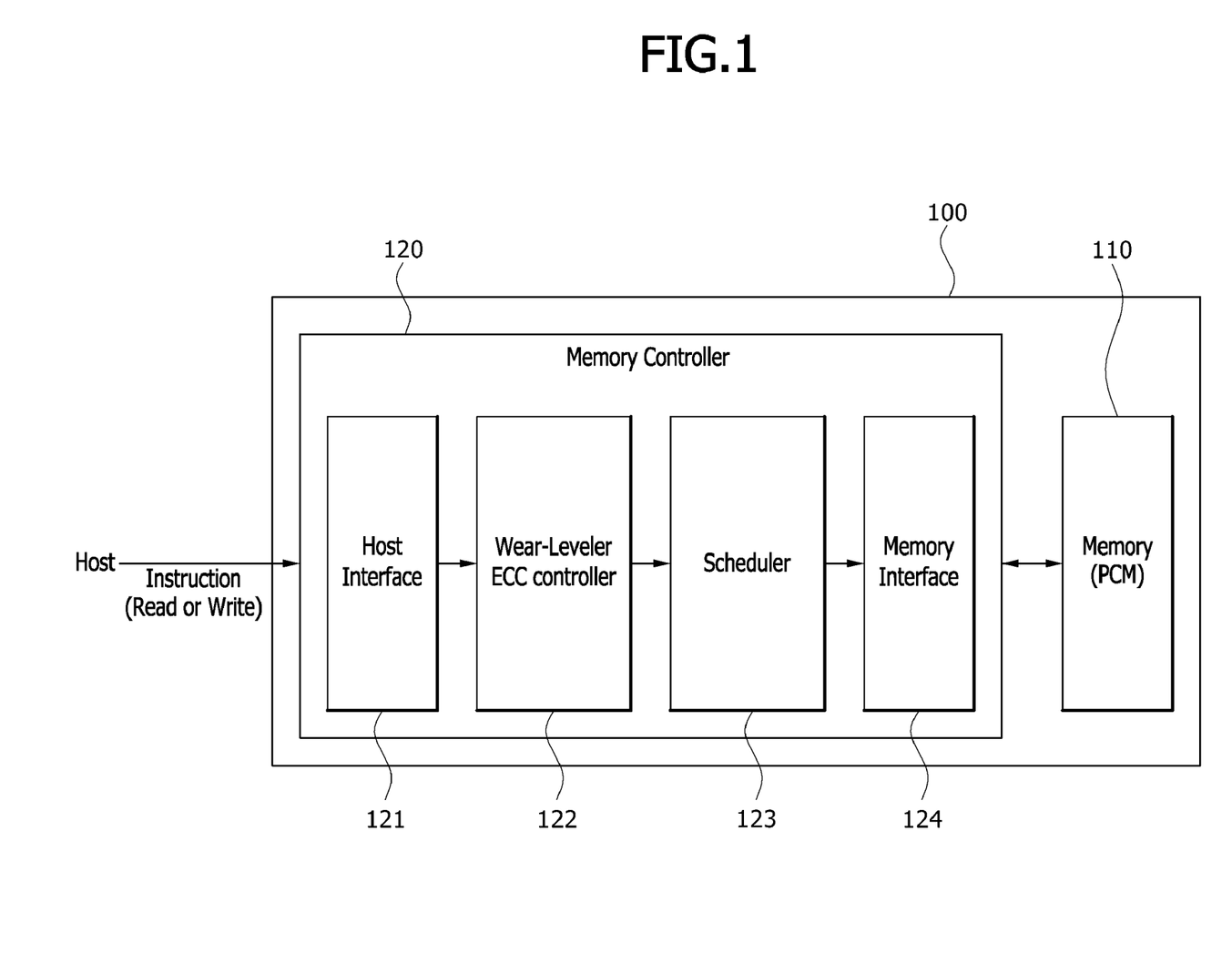
FIG. 1 is a block diagram illustrating an example of a memory system according to an embodiment of the present disclosure.
Figure 2:
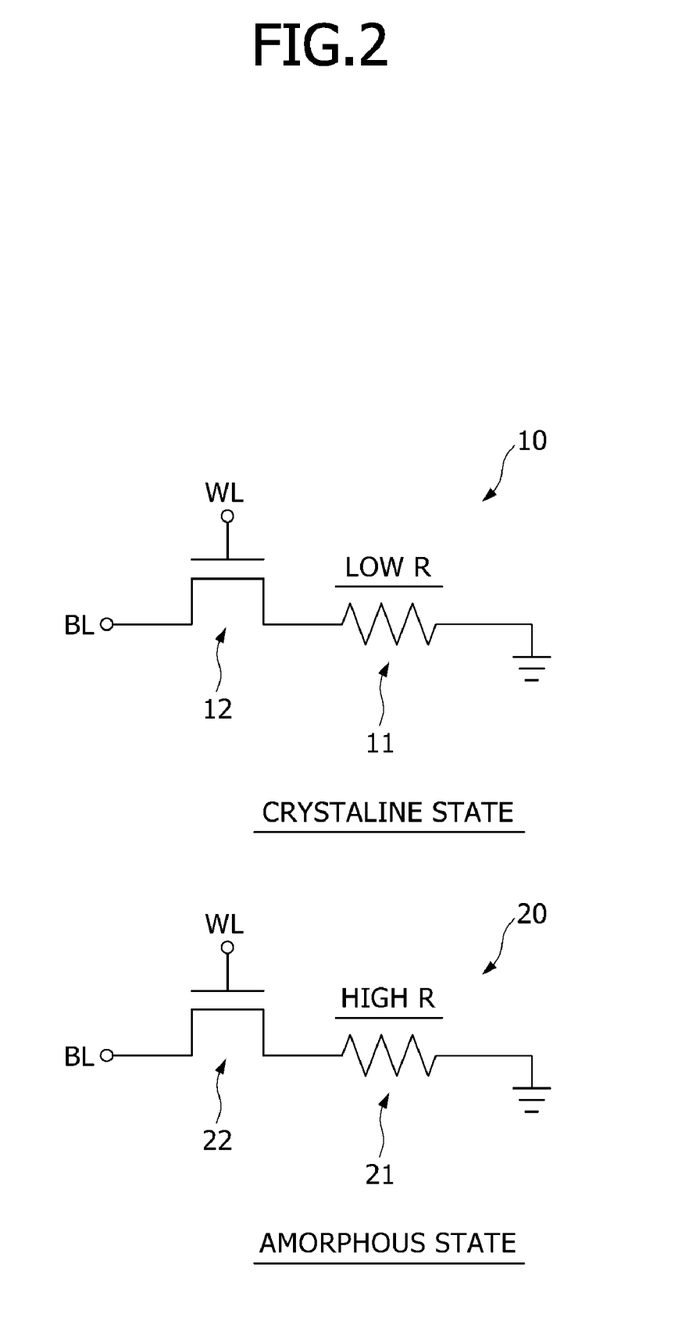
FIG. 2 illustrates two different equivalent circuit diagrams of a phase change memory (PCM) cell employed in a memory device included in the memory system of FIG. 1.

FIG. 1 is a block diagram illustrating an example of a memory system 100 according to an embodiment, and FIG. 2 illustrates two different equivalent circuit diagrams 10 and 20 of a phase change memory (PCM) cell employed in a memory device 110 included in the memory system 100 of FIG. 1. Referring to FIG. 1, the memory system 100 may be configured to include the memory device 110 and a memory controller 120. In an embodiment, the memory device 110 may be a PCM device. In an embodiment, the memory device 110 may be a ferroelectric random access memory (FeRAM) device, a magnetic random access memory (MRAM) device, a resistive random access memory (RRAM) device, or the like. The present embodiment will be described in conjunction with an example in which the memory device 110 is a PCM device. The PCM device may be configured to include a plurality of PCM cells which are arrayed on a substrate. Each of the PCM cells may be realized using a phase changeable material. The phase changeable material may be a chalcogenide compound material having an electric resistance that changes according to temperature. That is, the phase changeable material may have a crystalline state or an amorphous state according to a temperature to exhibit a switching characteristic. For example, the chalcogenide compound material may be an alloy material of germanium (Ge), stibium (Sb) and tellurium (Te) (hereinafter, referred to as a GST material). The GST material may have an amorphous state if the GST material is heated to a temperature which is higher than a melting point thereof and is cooled down rapidly. In contrast, the GST material having an amorphous state may be transformed to have a crystalline state if the GST material having an amorphous state is heated to a temperature between a crystallization temperature and a melting point thereof and is gradually cooled down. The GST material may be heated up by forcing a current into the GST material. A phase of the GST material may be changed within a short period, for example, within approximately five nanoseconds.

As illustrated in FIG. 2, a PCM cell 10 may be configured to include an alloy resistor 11 having a crystalline state and a selection transistor 12 which are coupled in series between a bit line BL and a ground voltage terminal. If the alloy resistor 11 has a crystalline state, an electrical resistivity of the alloy resistor 11 may be relatively low to correspond to a logic "high" level or a logic "1" level. If a word line voltage is applied to a word line WL connected to a gate of the selection transistor 12 to turn on the selection transistor 12, a relatively large current may flow from the bit line BL toward the ground voltage terminal through the selection transistor 12 and the alloy resistor 11 because the alloy resistor 11 having a crystalline state has a relatively low resistivity. In such a case, a voltage level of the bit line BL, which is pre-charged, may be pulled down to a ground voltage. If a large current flows through the alloy resistor 11, a phase of the alloy resistor 11 may change. Specifically, if a large current flows through the alloy resistor 11 to generate heat, a temperature of the alloy resistor 11 may reach a melting point of the alloy resistor 11 and the alloy resistor 11 may melt to have a liquid state (i.e., a fluid state). If the alloy resistor 11 having a fluid state is rapidly cooled down, the alloy resistor 11 may be solidified to have an amorphous state because there is no sufficient time for atoms of the alloy resistor 11 to be rearranged.

Referring again to FIG. 2, another PCM cell 20 may be configured to include an alloy resistor 21 having an amorphous state and a selection transistor 22 which are coupled in series between the bit line BL and the ground voltage terminal. If the alloy resistor 21 has an amorphous state, an electrical resistivity of the alloy resistor 21 may be relatively high to correspond to a logic "low" level or a logic "0" level. If a word line voltage is applied to a word line WL connected to a gate of the selection transistor 22 to turn on the selection transistor 22, a relatively small current may flow from the bit line BL toward the ground voltage terminal through the selection transistor 22 and the alloy resistor 21 because the alloy resistor 21 having an amorphous state has a relatively high resistivity. In such a case, the bit line BL may maintain a pre-charged state. If a small current flows through the alloy resistor 21 having an amorphous state during a relatively long period, the alloy resistor 21 may be heated to reach a crystallization temperature but not to reach the melting point because the small current flowing through the alloy resistor 21 is insufficient to melt the alloy resistor 21. Thus, the alloy resistor 11 may be gradually transformed to have a crystalline state.

As described above, a relatively large current has to be supplied into the PCM cell during a relatively short period in order to perform a write operation for transforming the alloy resistor 11 having a logic "high(1)" level into the alloy resistor 11 having a logic "low(0)" level. In contrast, a relatively small current has to be supplied into the PCM cell during a relatively long period in order to perform a write operation for transforming the alloy resistor 21 having a logic "low(0)" level into the alloy resistor 21 having a logic "high(1)" level. Accordingly, electric power consumed during a write operation for changing a logic "high(1)" level of the PCM cell into a logic "low(0)" level may be different from electric power consumed during a write operation for changing a logic "low(0)" level of the PCM cell into a logic "high(1)" level. A cell current flowing through the PCM cell 10 or 20 during a read operation may be smaller than a cell current flowing through the PCM cell 10 or 20 during the write operation. Thus, electric power consumed during a read operation of the PCM device may be lower than electric power consumed during a write operation of the PCM device.

Referring again to FIG. 1, the memory controller 120 may receive an instruction, for example, a read instruction or a write instruction from a host and may control the memory device 110 to execute operations corresponding to the instruction. The memory controller 120 may be configured to include a host interface 121, a wear-leveler/error correction code (ECC) controller 122, a scheduler 123 and a memory interface 124 to control the operation of the memory device 110. The memory controller 120 may communicate with the host through the host interface 121. The wear-leveler/ECC controller 122 may control a wear-leveling operation for the memory device 110 and may control an error correction operation for data during a read operation or a write operation. The scheduler 123 may determine a process sequence of the instructions outputted from the host and may execute the instructions according to the determined process sequence. The memory controller 120 may communicate with the memory device 110 through the memory interface 124.

Figure 3:
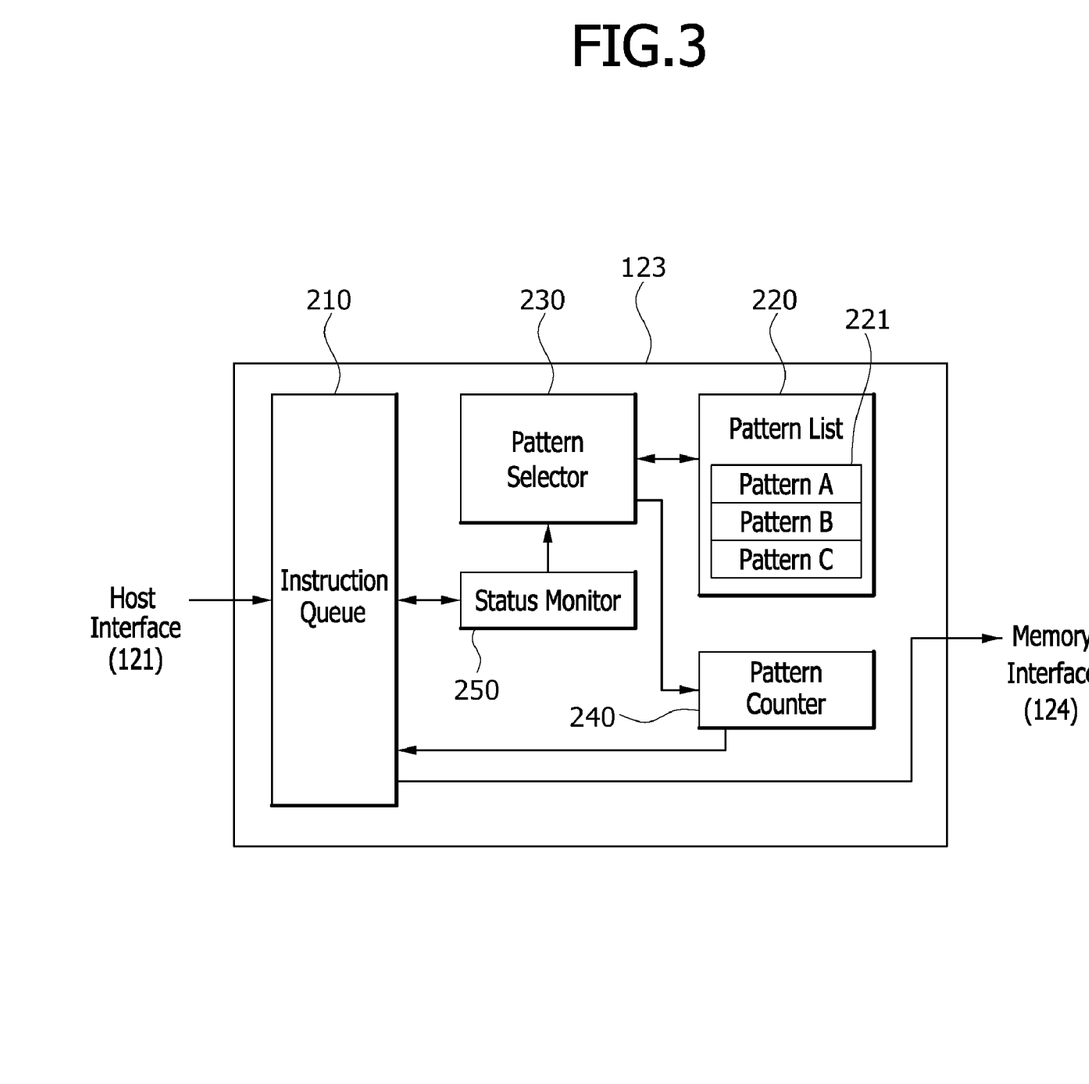
FIG. 3 is a block diagram illustrating a scheduler included in the memory system of FIG. 1.
Figure 4:
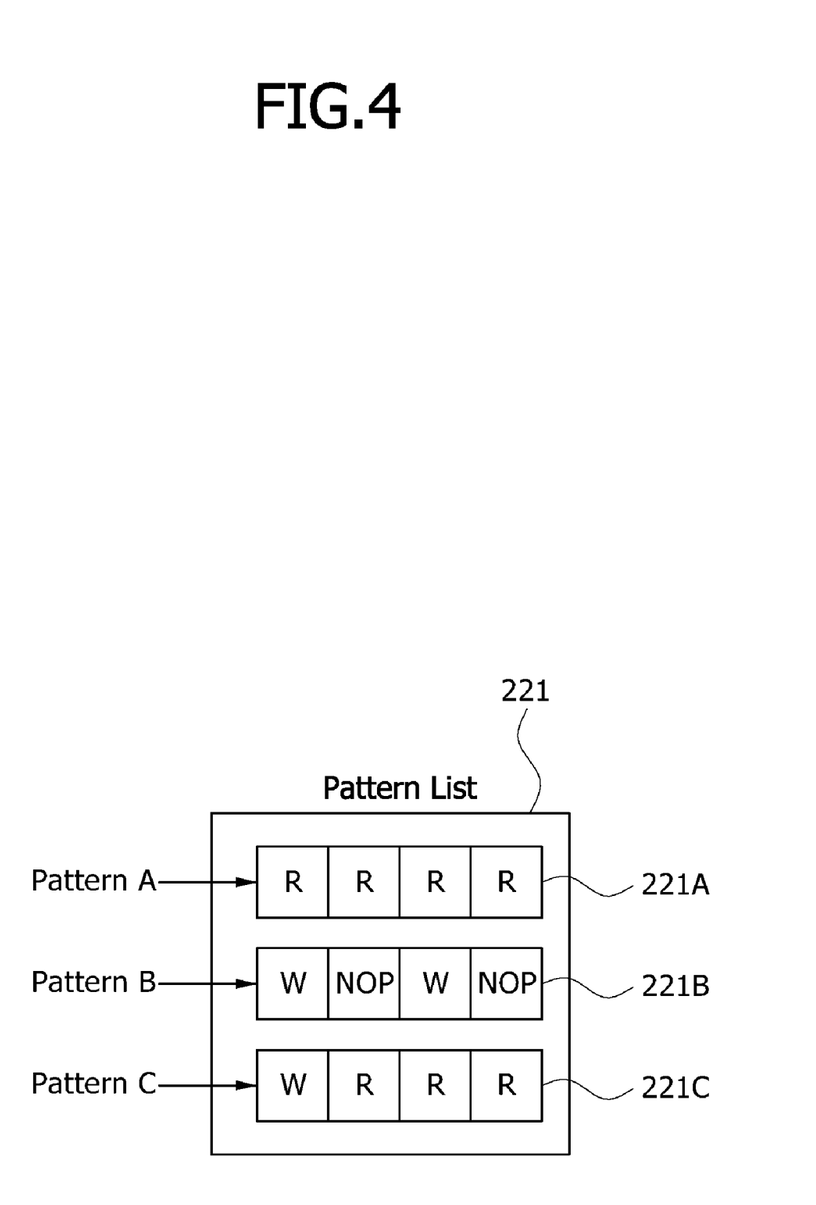
FIG. 4 illustrates an example of a pattern list in a pattern storage part included in the scheduler of FIG. 3.

FIG. 3 is a block diagram illustrating the scheduler 123 included in the memory system 100 of FIG. 1, and FIG. 4 illustrates an example of a pattern list in a pattern storage part 220 included in the scheduler 123 of FIG. 3. Referring to FIG. 3, the scheduler 123 may be configured to include an instruction queue 210, the pattern storage part 220, a pattern selector 230, a pattern counter 240 and a status monitor 250. The instruction queue 210 may sequentially store the instructions, for example, the read instruction and the write instruction which are outputted from the host. The instructions outputted from the host may be inputted to the instruction queue 210 through the host interface (121 of FIG. 1). The pattern storage part 220 may include a pattern list 221 in which a plurality of patterns (e.g., patterns A, B and C) are stored. In an embodiment, for example, the pattern storage part 220 may prepare a pattern list 221 in which a plurality of patterns (e.g., patterns A, B and C) are stored. One of the patterns A, B and C may include a plurality of read instructions which are sequentially arrayed or a plurality of write instructions which are sequentially arrayed. Another one of the patterns A, B and C may include at least one of the read instructions and at least one of the write instructions, which are sequentially arrayed. In either case, the patterns A, B and C may be designed such that electric power consumed when operations corresponding to the instructions included in each of the patterns A, B and C are sequentially performed is lower than an upper limit of the allowable electric power range.

Referring to FIG. 4, in an embodiment, the pattern list 221 may include a first storage pattern 221A corresponding to the pattern A, a second storage pattern 221B corresponding to the pattern B, and a third storage pattern 221C corresponding to the pattern C. Each of the first to third storage patterns 221A, 221B and 221C may include at least two storage elements, for example, four storage elements which are arrayed in series, and each of the storage elements may store a single instruction. The pattern list 221 illustrated in FIG. 4 may be merely an example of suitable pattern lists. Accordingly, an array sequence of the instructions stored in each of the first to third storage patterns 221A, 221B and 221C may be modified or changed under a condition that the electric power consumed when operations corresponding to the instructions included in each of the first to third storage patterns 221A, 221B and 221C are sequentially performed is lower than an upper limit of the allowable electric power range. The first storage pattern 221A may have only four read instructions R. Thus, if a schedule set by the first storage pattern 221A is executed, the four read instructions R may be synchronized with a clock signal to sequentially perform four read operations. As described with reference to FIG. 2, the electric power consumed during the read operation of the PCM device may be lower than the electric power consumed during the write operation of the PCM device. Thus, even though the four read instructions R stored in the first storage pattern 221A are sequentially executed, the power consumption may be lower than an upper limit of the allowable electric power range.

The second storage pattern 221B may have only two write instructions W. That is, two write instructions may be respectively stored in the first and third storage elements of the second storage pattern 221B, and two non-operating instructions (NOPs) may be respectively stored in the second and fourth storage elements of the second storage pattern 221B. The NOP means to skip the read or write instruction. If a schedule set by the second storage pattern 221B is executed, the first write instruction W may be synchronized with a first pulse of the clock signal to perform a first write operation and no operation may be performed in response to a second pulse of the clock signal. In addition, the second write instruction W may be synchronized with a third pulse of the clock signal to perform a second write operation and no operation may be performed in response to a fourth pulse of the clock signal. Even though the second storage pattern 221B has two write instructions W causing two write operations, each of which consumes relatively high electric power as compared with the read operation, the total electric power consumed during the two write operations performed by the second storage pattern 221B may be lower than an upper limit of the allowable electric power range because no operation is performed in response to the second and fourth pulses of the clock signal.

The third storage pattern 221C may have one write instruction W and three read instructions R. That is, one write instruction W may be stored in the first storage element of the third storage pattern 221C, and three read instructions R may be respectively stored in the second to fourth storage elements of the third storage pattern 221C. If a schedule set by the third storage pattern 221C is executed, the one write instruction W may be synchronized with a first pulse of the clock signal to perform a first write operation and the three read instructions R may be respectively synchronized with second to fourth pulses of the clock signal to sequentially perform first to third read operations. Even in such a case, the total electric power consumed while the schedule set by the third storage pattern 221C is executed may be lower than an upper limit of the allowable electric power range. However, since the third storage pattern 221C has one write instruction W without any non-operating instruction, the total electric power consumed while the schedule set by the third storage pattern 221C is executed may be higher than the electric power consumed while the schedule set by the first or second storage pattern 221A or 221B is executed. Thus, it may be necessary to design the scheduler 123 to prevent a write instruction from being executed immediately after the schedule set by the third storage pattern 221C is executed. In some embodiments, the scheduler 123 may be configured to prevent a write instruction from being executed immediately after the schedule set by the second storage pattern 221B or the third storage pattern 221C is executed. In some embodiments, for example, the scheduler 123 may be configured to prevent a write instruction from being executed after the schedule set by the second storage pattern 221B or the third storage pattern 221C is executed and before any other instruction is executed.

Referring again to FIG. 3, the pattern selector 230 may receive information on statuses of instructions stored in the instruction queue 210 and may analyze the instructions stored in the instruction queue 210 to select any one of the patterns A, B and C stored in the pattern list 221. Subsequently, the pattern selector 230 may output information on the selected pattern such that the instructions stored in the instruction queue 210 are executed in a process sequence set by the selected pattern. The pattern selector 230 may select any one of the patterns A, B and C according to a specific requirement condition. For example, the pattern selector 230 may select one of the patterns A, B and C according to a ratio of the number of read instructions stored in the instruction queue 210 to the number of write instructions stored in the instruction queue 210. That is, if the number of the read instructions stored in the instruction queue 210 is greater than the number of the write instructions stored in the instruction queue 210, the pattern selector 230 may select the pattern mainly comprised of read instructions among the patterns A, B and C. In contrast, if the number of the write instructions stored in the instruction queue 210 is greater than the number of the read instructions stored in the instruction queue 210, the pattern selector 230 may select the pattern mainly comprised of write instructions among the patterns A, B and C.

The pattern counter 240 may receive information on the pattern which is selected by the pattern selector 230. The pattern counter 240 may count and store the number of times that the patterns stored in the pattern list 221 are used. In addition, the pattern counter 240 may generate a schedule of the instructions stored in the instruction queue 210 such that the instructions in the instruction queue 210 are executed in a process sequence set by the storage pattern selected by the pattern selector 230. The instruction queue 210 may transmit the read instructions and/or the write instructions in the process sequence defined by the schedule set by the pattern counter 240 to the memory device (110 of FIG. 1) through the memory interface 124.

The status monitor 250 may monitor a status of the instruction queue 210 and may output information on statuses of the instructions stored in the instruction queue 210 to the pattern selector 230. In some embodiments, the status of the instruction queue 210 may include a distribution of the external instructions stored in an instruction queue 210. The distribution of the external instructions stored in an instruction queue 210 may be a ratio of a number of read instructions to a number of write instructions stored in the instruction queue 210. In an embodiment, whenever the read instruction or the write instruction is transmitted from the host to the instruction queue 210 of the scheduler 123 through the host interface 121, the status monitor 250 may receive and update information on an array status of the instructions stored in the instruction queue 210 to transmit the updated information to the pattern selector 230.

Figure 5:
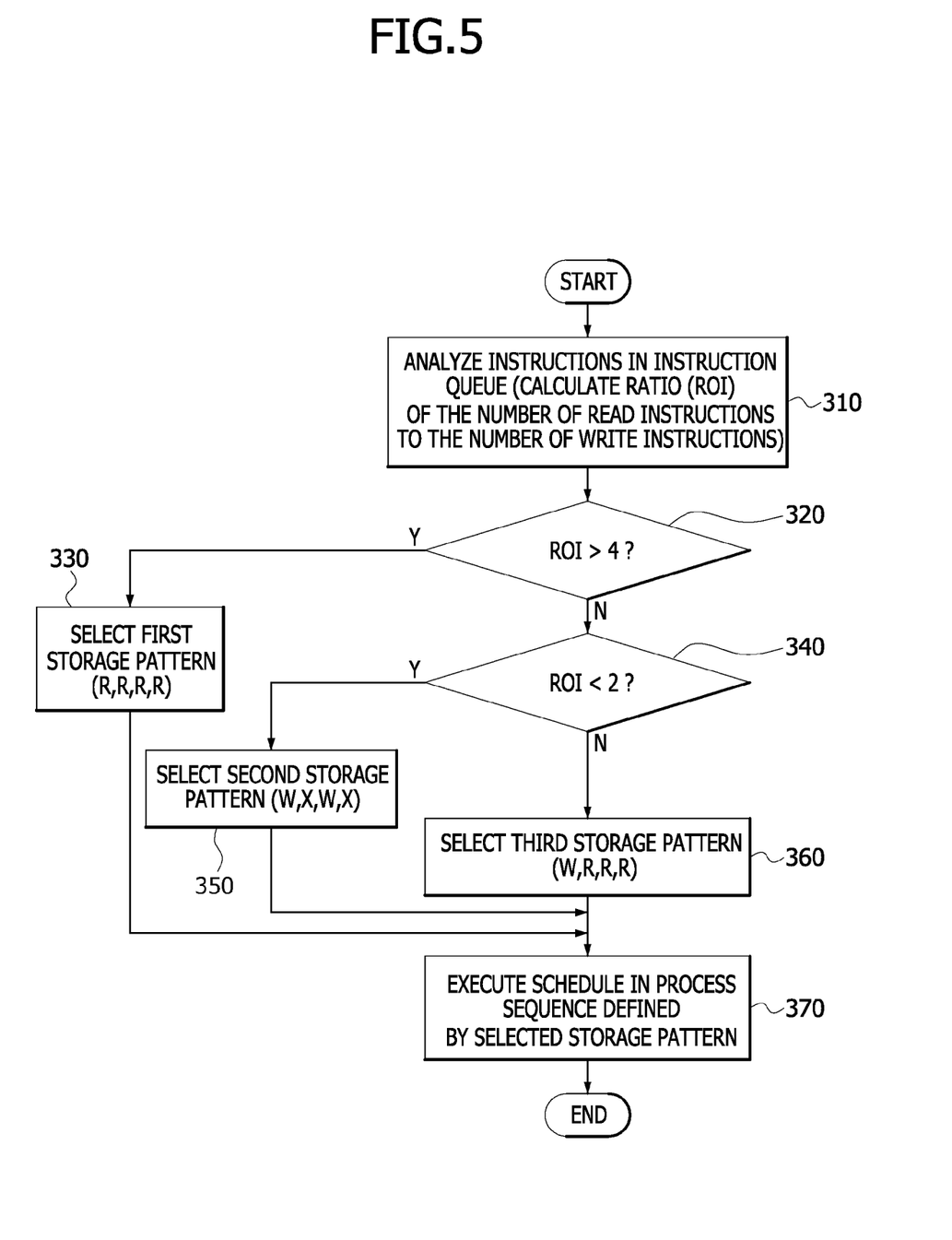
FIG. 5 is a flowchart illustrating a method of scheduling a memory system according to an embodiment of the present disclosure.

FIG. 5 is a flowchart illustrating a method of scheduling the memory system 100 illustrated in FIG. 1. Referring to FIG. 5 together with FIGS. 3 and 4, the pattern selector 230 may receive information on statuses of instructions stored in the instruction queue 210 from the status monitor 250 and may analyze the information on statuses of instructions stored in the instruction queue 210 (see a step 310 of FIG. 5). The information on statuses of instructions stored in the instruction queue 210 may be analyzed using any one of various manners. For example, the information on statuses of instructions stored in the instruction queue 210 may be analyzed by calculating a ratio ROI of the number of read instructions stored in the instruction queue 210 to the number of write instructions stored in the instruction queue 210. In such a case, one of the patterns (e.g., the first to third storage patterns 221A, 221B and 221C) in the pattern storage part 220 may be selected according to the ratio ROI of the number of the read instructions stored in the instruction queue 210 to the number of the write instructions stored in the instruction queue 210. The instructions outputted from the host may be cumulatively stored in the instruction queue 210. The instructions outputted from the host may include at least one read instruction and/or at least one write instructions. In an embodiment, the number of the read instructions arrayed in the instruction queue 210 may be greater or less than the number of the write instructions arrayed in the instruction queue 210. In another embodiment, only the read instructions may be arrayed in the instruction queue 210, or only the write instructions may be arrayed in the instruction queue 210.

After the ratio ROI of the number of the read instructions to the number of the write instructions in the instruction queue 210 is calculated in the step 310, the pattern selector 230 may discriminate whether the ratio ROI of the number of the read instructions to the number of the write instructions is greater than a first reference value (see a step 320 of FIG. 5). The first reference value may have one of various values according to the patterns stored in the pattern list 221. As illustrated in FIG. 4, if the first storage pattern 221A among the first to third storage patterns 221A, 221B and 221C includes only four read instructions (R,R,R,R), the first reference value may be defined as four which is equal to the number of the read instructions R stored in the first storage pattern 221A. In such a case, if the ratio ROI of the number of the read instructions to the number of the write instructions, which is calculated in the step 310, is greater than four (i.e., the instructions in the instruction queue 210 are arrayed under a read dominant condition), the first storage pattern 221A including only the read instructions R may be selected (see a step 330 of FIG. 5). After the first storage pattern 221A is selected, a schedule set by the first storage pattern 221A may be executed (see a step 370 of FIG. 5).

If the ratio ROI of the number of the read instructions to the number of the write instructions, which is calculated in the step 310, is equal to or less than the first reference value of four, the pattern selector 230 may discriminate whether the ratio ROI of the number of the read instructions to the number of the write instructions is less than a second reference value (see a step 340 of FIG. 5). The second reference value may also have one of various values according to the patterns stored in the pattern list 221, like the first reference value. As illustrated in FIG. 4, if the second storage pattern 221B among the first to third storage patterns 221A, 221B and 221C includes only two write instructions (W,X,W,X), the second reference value may be defined as two which is equal to the number of the write instructions W stored in the second storage pattern 221B. In such a case, if the ratio ROI of the number of the read instructions to the number of the write instructions, which is estimated in the step 340, is less than two (i.e., the instructions in the instruction queue 210 are arrayed under a write dominant condition), the second storage pattern 221B including only the write instructions W may be selected (see a step 350 of FIG. 5). After the second storage pattern 221B is selected, a schedule set by the second storage pattern 221B may be executed (see the step 370 of FIG. 5).

If the ratio ROI of the number of the read instructions to the number of the write instructions is equal to or greater than the second reference value in the step 340, it may be understood that the ratio ROI of the number of the read instructions to the number of the write instructions is equal to or greater than two (i.e., the second reference value) and is equal to or less than four (i.e., the first reference value). That is, a range of the ratio ROI may be expressed by an equation of "2≤ROI≤4". In such a case, a storage pattern including a plurality of read instructions R and one write instruction W may be selected. As illustrated in FIG. 4, the third storage pattern 221C among the first to third storage patterns 221A, 221B and 221C includes one write instruction and three read instructions (W,R,R,R) which are sequentially arrayed. Thus, if the ratio ROI of the number of the read instructions to the number of the write instructions is equal to or greater than two in the step 340, the third storage pattern 221C may be selected (see a step 360 of FIG. 5). After the third storage pattern 221C is selected, a schedule set by the selected third storage pattern 221C may be executed (see the step 370 of FIG. 5).

After the first, second or third storage pattern 221A, 221B or 221C is selected in the step 330, 350 or 360, a schedule set by the selected storage pattern may be executed in a process sequence defined by the selected storage pattern (see the step 370 of FIG. 5). In such a case, the pattern selector 230 may transmit information on the selected storage pattern to the pattern counter 240. The pattern counter 240 may generate a schedule of the instructions stored in the instruction queue 210 such that the instructions stored in the instruction queue 210 are executed in a process sequence defined by the information outputted from the pattern selector 230. The instruction queue 210 may output the read instructions and/or the write instructions to the memory device (110 of FIG. 1) through the memory interface (124 of FIG. 1) in a sequence defined by the schedule set by the pattern counter 240.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A scheduler of a memory system, the scheduler comprising:
a pattern storage part configured to have a plurality of storage patterns, each of the storage patterns providing for a process sequence for a plurality of instructions; and
a pattern selector configured to select one of the plurality of storage patterns in the pattern storage part and configured to generate a schedule such that external instructions are executed in the process sequence set by the selected storage pattern,
wherein the plurality of storage patterns includes:
a first storage pattern including a plurality of read instructions arrayed to be executed in a first sequence;
a second storage pattern including a plurality of write instructions arrayed to be executed in a second sequence; and
a third storage pattern including at least one read instruction and at least one write instruction arrayed to be executed in a third sequence, and
wherein the pattern selector is configured to prevent an additional write instruction from being executed after the schedule set by the second storage pattern or the third storage pattern is executed and before any other instruction is executed.

2. The scheduler of claim 1, wherein the plurality of storage patterns are configured such that electric power consumed while instructions included in each of the plurality of storage patterns are executed in the instruction process sequence is lower than an upper limit of an allowable electric power range.

3. The scheduler of claim 1,
wherein the second storage pattern further includes a non-operating instruction arrayed between two adjacent ones of the plurality of write instructions; and
wherein the non-operating instruction means that no instruction is executed.

4. The scheduler of claim 1, further comprising an instruction queue configured to sequentially store read instructions and write instructions which are outputted from a host,
wherein the read instructions and the write instructions outputted from the host constitutes the external instructions.

5. The scheduler of claim 4, wherein the pattern selector is configured to select one of the storage patterns included in the pattern storage part according to a distribution of the read instructions or the write instructions stored in the instruction queue.

6. The scheduler of claim 5,
wherein the pattern selector selects one storage pattern dominantly including the read instructions among the storage patterns if the number of the read instructions stored in the instruction queue is greater than the number of the write instructions stored in the instruction queue; and wherein the pattern selector selects one storage pattern dominantly including the write instructions among the storage patterns if the number of the read instructions stored in the instruction queue is less than the number of the write instructions stored in the instruction queue.

7. The scheduler of claim 4, further comprising:
a status monitor configured to transmit information on statuses of the external instructions stored in the instruction queue to the pattern selector.

8. The scheduler of claim 4, further comprising:
a pattern counter configured to generate a schedule of the external instructions stored in the instruction queue such that the external instructions in the instruction queue are executed in a process sequence set by the storage pattern selected by the pattern selector.

9. The scheduler of claim 8, wherein the pattern counter is configured to count and store the number of times that a storage pattern stored in the pattern storage part is used in the execution of the external instructions.

10. A method of scheduling a memory system, the method comprising:
preparing a pattern list having a plurality of storage patterns, each of the storage patterns providing for a process sequence for a plurality of instructions;
selecting one of the plurality of storage patterns in the pattern list; and
generating a schedule such that external instructions are executed in the process sequence set by the selected storage pattern,
wherein the plurality of storage patterns includes:
a first storage pattern including a plurality of read instructions arrayed to be executed in a first sequence;
a second storage pattern including a plurality of write instructions arrayed to be executed in a second sequence; and
a third storage pattern including at least one read instruction and at least one write instruction arrayed to be executed in a third sequence, and
wherein the selected storage pattern has no write instruction if the second or third storage pattern is selected for a previous schedule.

11. The method of claim 10, wherein the plurality of storage patterns are configured such that electric power consumed while instructions included in each of the plurality of storage patterns are executed in the instruction process sequence is lower than an upper limit of an allowable electric power range.

12. The method of claim 10,
wherein the second storage pattern further includes a non-operating instruction arrayed between two adjacent ones of the plurality of write instructions; and
wherein the non-operating instruction means that no instruction is executed.

13. The method of claim 10, further comprising:
analyzing a distribution of the external instructions stored in an instruction queue before selecting one of the plurality of storage patterns in the pattern list.

14. The method of claim 13,
wherein selecting one of the plurality of storage patterns is performed such that the selected storage pattern dominantly includes read instructions if the number of read instructions stored in the instruction queue is greater than the number of write instructions stored in the instruction queue; and
wherein selecting one of the plurality of storage patterns is performed such that the selected storage pattern dominantly includes write instructions if the number of read instructions stored in the instruction queue is less than the number of write instructions stored in the instruction queue.

15. The method of claim 13, wherein analyzing the distribution of the external instructions stored in the instruction queue includes calculating a ratio of a number of read instructions to a number of write instructions stored in the instruction queue.

16. The method of claim 15, further comprising:

selecting a first storage pattern from the plurality of storage patterns if the ratio is greater than a first reference value;

selecting a second storage pattern from the plurality of storage patterns if the ratio is less than a second reference value;

selecting a third storage pattern from the plurality of storage patterns if the ratio is greater than or equal to the second reference value and less than or equal to the first reference value.

* * * * *